United States Patent
Schell et al.

(10) Patent No.: US 7,639,098 B2
(45) Date of Patent: Dec. 29, 2009

(54) METHODS AND APPARATUS FOR REDUCING PEAK-TO-RMS AMPLITUDE RATIO IN COMMUNICATION SIGNALS

(75) Inventors: Stephen V. Schell, San Mateo, CA (US); Richard W. D. Booth, Los Gatos, CA (US)

(73) Assignee: Panasonic Corporation, Osaka (JP)

( * ) Notice: Subject to any disclaimer, the term of this patent is extended or adjusted under 35 U.S.C. 154(b) by 177 days.

(21) Appl. No.: 12/042,689

(22) Filed: Mar. 5, 2008

(65) Prior Publication Data

US 2009/0108951 A1  Apr. 30, 2009

Related U.S. Application Data

(60) Provisional application No. 60/906,931, filed on Mar. 14, 2007.

(51) Int. Cl.
*H03K 7/02* (2006.01)

(52) U.S. Cl. .......................... 332/115; 332/107; 375/353
(58) Field of Classification Search ................. 332/106, 332/107, 115, 116; 375/353
See application file for complete search history.

(56) References Cited

U.S. PATENT DOCUMENTS 6,894,559 B1 * 5/2005 Dolman ....................... 330/10
7,054,385 B2   5/2006 Booth et al.

* cited by examiner

*Primary Examiner*—David Mis

(57) ABSTRACT

A pulse amplitude modulation (PAM) signal generator that injects a copy of a pulse into the PAM baseband signal prior to frequency upconversion and power amplification. The pulse comprises a function of, or an extra copy of, a pulse in the PAM baseband signal. The pulse injector analyzes the PAM baseband signal for times when a predetermined threshold is exceeded and forms a pulse that is constructed and arranged to reduce the amplitude of the PAM baseband signal to a desired peak amplitude when the pulse is added to the PAM baseband signal.

20 Claims, 10 Drawing Sheets

METHODS AND APPARATUS FOR REDUCING PEAK-TO-RMS AMPLITUDE RATIO IN COMMUNICATION SIGNALS

CROSS-REFERENCE TO RELATED APPLICATIONS

This patent application claims the benefit of U.S. Provisional Patent Application No. 60/906,931, filed on Mar. 14, 2007, the disclosure of which is hereby incorporated by reference.

FIELD OF THE INVENTION

The present invention relates to pulse amplitude modulation and, more particularly, to a pulse amplitude modulation (PAM) signal generator capable of reducing the peak-to-RMS amplitude ratio of communication signals without spectral degradation.

BACKGROUND OF THE INVENTION

Many modern communication systems transmit messages using signals having amplitudes that vary significantly over time. Typically, the power capability of the output device in the transmitter (e.g. the final amplifier) must be selected to accommodate the peak amplitude, or perhaps the amplitude at the $99^{th}$ percentile, below which 99% of the amplitudes in the signal occur, or perhaps at the $99.9^{th}$ percentile as another example. In other words, the selection of the output device is governed as much (or more so) by the peak-power requirement as it is by the average power requirement, where the average power is typically the measurement specified directly in the specification document for a communication system. The selection of the output device is governed as much (or more so) by the peak-amplitude requirement as it is by the RMS-amplitude requirement. Therefore, the output device selection requires tradeoffs between accurate reproduction of the signal on the one hand (hereinafter referred to as "communication quality") and, on the other hand, power efficiency, power consumption, size of the output device, etc. (hereinafter referred to as "device efficiency").

Improving the output device efficiency, especially the power efficiency, is highly desirable since transmitters (such as those found in battery operated cellular telephone) have a limited battery source to operate the device. Additionally, improving the device efficiency is beneficial for transmitters constrained by their cooling means, so that thermal damage to the device (e.g., handheld transmitters operating with high duty cycle, or high-power transmitters in base stations in cellular telephone systems) can be prevented. For these applications and others, it is desirable to minimize the ratio between the peak amplitude (or $99^{th}$ percentile or $99.9^{th}$ percentile) and the root-mean-square (RMS) amplitude, in order to facilitate efficient power transmission.

One conventional approach to power-efficient transmission is a so-called linear amplifier that operates in a partially linear and partially nonlinear mode, characterized by a phenomenon known as amplitude compression. In this mode, a small input amplitude A gives rise to a larger output amplitude $$B = gA$$

where g is the small-signal gain of the amplifier. As the input amplitude A increases, the actual gain of the amplifier decreases below g. Thus, the corresponding output amplitude B is not quite as large as it should be. In other words, the amplifier output is not truly proportional to the input. This effectively reduces the peak-to-RMS ratio, which in turn has the benefits of power-efficiency previously described.

A major disadvantage of the linear amplifier approach is that it degrades the signal quality. Typically, some amount of signal quality degradation is accepted in a system design, in exchange for slightly improved power efficiency or reduced heat dissipation. Nonetheless, the conventional (linear amplifier) approach degrades both standard measures of quality, namely an in-band quality measure and an out-of-band quality measure. The in-band quality measure is the RMS error vector magnitude (EVM). A mathematically related measure is RHO which is the normalized cross-correlation coefficient between the transmitted signal and its ideal version. The EVM and RHO relate to the ease with which an intended receiver can extract the message from the transmitted signal. As the EVM increases above zero, or RHO decreases below one, the transmitted signal becomes increasingly distorted compared to the ideal signal. This distortion increases the likelihood that the receiver will make errors while extracting the message.

The out-of-band quality measure is the power spectral density (PSD) of the transmitted signal, or some measure derived therefrom. Of particular interest in the PSD is the degree to which the transmitted signal interferes with other radio channels. In a wireless communications network, to minimize interference with other radio channels, the overall capacity of the network is reduced or limited (e.g., the number of simultaneous users is reduced or limited).

Therefore, any means of reducing the peak-to-RMS ratio must create as little interference as possible (minimal degradation to out-of-band signal quality) while simultaneously maintaining the in-band measure of signal quality (i.e., EVM or RHO) at an acceptable level. The conventional (linear amplifier) approach degrades both out-of-band signal quality and in-band signal quality to reduce peak-to-RMS ratio. In fact, for some signals the conventional (linear amplifier) approach is unable to maintain acceptable quality while delivering the required average power.

In view of the foregoing, it would be desirable to have a PAM signal generator that reduces the peak-to-RMS amplitude ratio of a communications signal to facilitate efficient power transmission and delivery of required average power, while preserving out-of-band signal quality.

It would also be desirable to have a PAM signal generator that modifies pulse amplitude modulated signals to reduce the peak-to-RMS amplitude ratio of the signals without degrading the power spectral density (PSD) of the signals and while simultaneously maintaining the in-band measure of signal quality (i.e., EVM or RHO) at acceptable levels.

SUMMARY OF THE INVENTION

Methods and apparatus for reducing the peak-to-RMS amplitude ratio of communication signals are disclosed. According to an exemplary embodiment, a pulse amplitude modulated (PAM) signal generator includes a modulator operable to modulate a signal with a PAM baseband signal, and a pulse injector operable to form a pulse and add the formed pulse into the PAM baseband signal at a time interval in which an amplitude of the PAM baseband signal exceeds a predetermined threshold, to create a modified baseband signal.

According to an exemplary method, a pulse or an extra copy of a pulse of a PAM baseband signal is generated to modify the PAM baseband signal to reduce the peak-to-RMS amplitude ratio without substantially degrading the power spectral density (PSD) of the signal.

An exemplary method for generating a pulse amplitude modulated (PAM) signal is also disclosed. The method includes modulating a signal with a PAM baseband signal; forming a pulse that is a copy of a pulse in the PAM baseband signal; and adding the formed pulse into the PAM baseband signal at a time interval in which an amplitude of the PAM baseband signal exceeds a predetermined threshold, to create a modified baseband signal.

Other features and advantages of the present invention will be understood upon reading and understanding the detailed description of the preferred exemplary embodiments, found hereinbelow, in conjunction with reference to the drawings, a brief description of which are provided below.

BRIEF DESCRIPTION OF THE DRAWINGS

FIG. 1B is a diagram illustrating how the PAM signal generator in FIG. 2 may be used in a basestation of a cellular communications network, according to an embodiment of the present invention.

DETAILED DESCRIPTION

Figure 1:
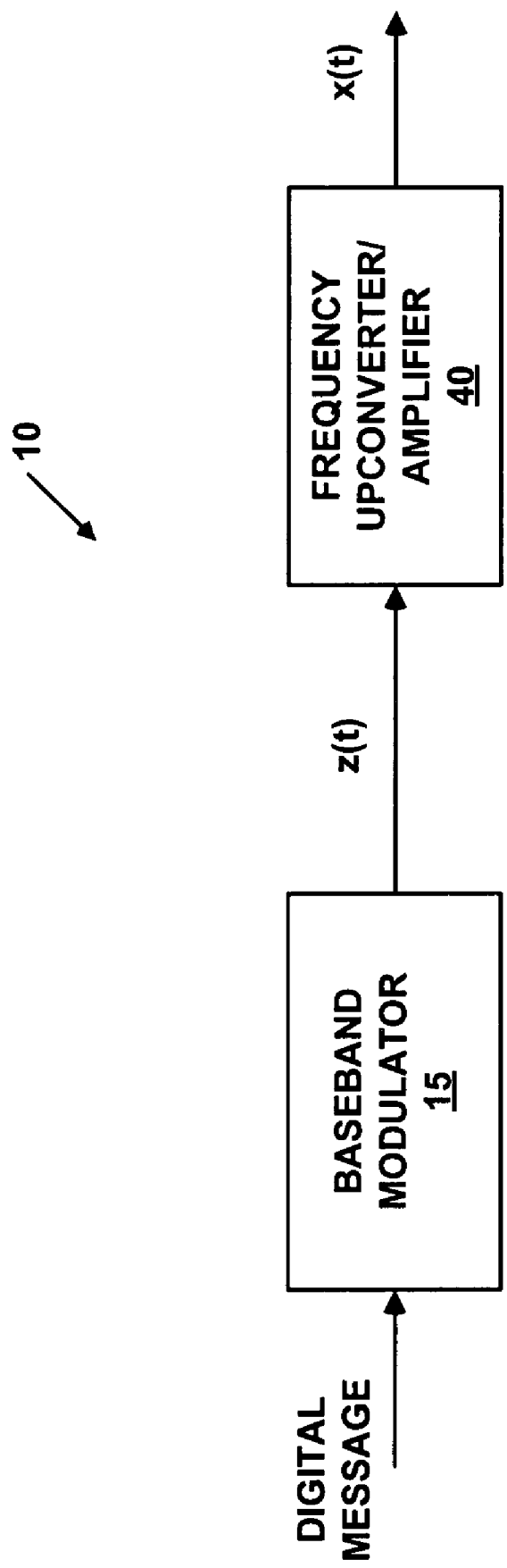
FIG. 1 is a block diagram of a conventional pulse amplitude modulation (PAM) signal generator.

FIG. 1 is a block diagram of a conventional pulse amplitude modulation (PAM) signal generator 10, which is well known in the prior art. Many modern communication systems transmit digital messages using a scheme called pulse amplitude modulation (PAM). A PAM signal is a frequency-upconverted sum of amplitude-scaled, phase-shifted, and time-shifted versions of a single pulse. The amplitude-scaling and phase-shifting of the $n^{th}$ time-shifted version of the pulse are determined by the $n^{th}$ component of the digital message.

In the field of communications systems, the broad class of PAM signals includes signals commonly referred to as PAM, quadrature amplitude modulation (QAM) and phase shift keying (PSK), and many variants recognized by those skilled in the art of communications theory. The PAM signal is generated in two parts, namely a baseband modulation process and a frequency-upconversion and amplification process, as illustrated in FIG. 1.

Referring still to FIG. 1, a digital message is modulated by baseband modulator 15 to form a modulated baseband signal z(t). The modulated baseband signal z(t) is then subjected to frequency upconversion and amplification by a frequency upconverter/amplifier 40 to produce output signal x(t) to be transmitted. The frequency-upconversion and amplification process is described mathematically by equation Eq. (1)

$$x(t) = Re\{gz(t)e^{j\omega_c t}\} \qquad \text{Eq. (1)}$$

where Re{ } denotes that real part of its complex argument; $\omega_c = 2\pi f_c$ defines the radio carrier frequency in radians per second; j is the imaginary square-root of negative unity; and, g is the amplifier gain. Equation Eq. (1) describes the frequency-upconversion process used to frequency-upconvert and amplify the complex baseband signal z(t), which is also called I/Q (inphase/quadrature) representation of the signal.

The modulated baseband signal z(t) created by the baseband modulator 15 is defined mathematically by Equation Eq. (2)

$$z(t) = \sum_n a_n p(t - nT) \qquad \text{Eq. (2)}$$

where p(t) is the pulse at time t; T is the symbol period (1/T is the symbol rate). For any time instant t at which z(t) is desired, the summation is taken over all values of n at which p(t-nT) is non-negligible. Also, $a_n$ is the symbol corresponding to the n component of the digital message. The symbol $a_n$ can be either real or complex, and can be obtained from the $n^{th}$ component of the digital message by means of either a fixed mapping or a time-variant mapping. An example of a fixed mapping occurs for quadrature phase shift key (QPSK) signals, in which the $n^{th}$ component of the digital message is an integer d, in the set {0, 1, 2, 3}, and the mapping is given by $a_n = \exp(j\pi d_n/2)$. An example of a time-variant mapping occurs for π/4-shifted QPSK which uses a modified QPSK mapping given by $a_n = \exp(j\pi(n+2d_n)/4)$; that is, the mapping depends on the time-index n, not only on the message value $d_n$.

Referring now to the present invention, an important property of a PAM signal is that the shape of the PSD of a PAM (as a function of frequency) signal is determined exclusively by the pulse p(t), under the assumption that the symbol sequence $a_n$ has the same second-order statistical properties as white noise. Moreover, the signal z(t) can be thought of as the output of a filter having an impulse response p(t) and being driven by a sequence of impulses with weights $a_n$. Accordingly, the PSD $S_x(f)$ of the output signal x(t) can be shown to be equal to mathematical equation Eq. (3)

$$S_x(f) = \frac{g^2 \sigma_a^2}{4T}(|P(f-f_c)|^2 + |P(f+f_c)|^2) \qquad \text{Eq. (3)}$$

where P(f) is the Fourier transform of the pulse p(t); and $\sigma_a^2$ is the mean-square value of the symbol sequence.

In view of the foregoing observation, it has been determined that adding extra copies of the pulse p(t) into the modulated baseband signal z(t) does not alter the shape of the PSD. As a result, adding extra copies of the pulse p(t) can be used to reduce the amplitude of the output signal x(t) as desired, such as when it would exceed some threshold.

In accordance with the present invention, the modulated baseband signal z(t) is modified by adding additional pulses thereto, to form new signals y(t) and ξ(t) defined by equations Eq. (4) and Eq. (5), respectively, $$y(t) = \sum_n a_n p(t-nT) + \sum_m b_m p(t-t_m) \qquad \text{Eq. (4)}$$

and $$\xi(t) = Re\{gy(t)e^{j\omega_c t}\} \qquad \text{Eq. (5)}.$$

The perturbation instances $t_m$ represent optimal times at which extra copies of the pulse p(t) are added to the modulated baseband signal z(t) to reduce the peak-to-RMS amplitude ratio of the signal. In other words, the perturbation instances $t_m$ define points in time at which it is desired to perturb the modulated baseband signal z(t) (e.g., whenever the amplitude of x(t) (or z(t)) exceeds some predetermined threshold). The threshold can be set based on any suitable criteria. For example, it may be set based on out-of-band spectral distortion limits specified by a desired adjacent channel leakage ratio (ACLR) or a desired adjacent channel power ratio (ACPR) and/or on in-band signal fidelity requirements specified by a desired EVM or RHO. The perturbation sequence $b_m$ represents the amplitude-scaling and phase-shifting to be applied to the pulse centered at time $t_m$ (e.g., chosen so as to reduce the amplitude of x(t) in the vicinity of time $t_m$). Like the first term in the modulated baseband signal y(t), the second term in y(t) can be thought of as the output of a filter having impulse response p(t) and being driven by a sequence of impulses with weights $b_m$. Thus, one can reasonably expect that the PSDs of ξ(t) and x(t) will have very similar shapes (as a function of frequency).

Figure 2:
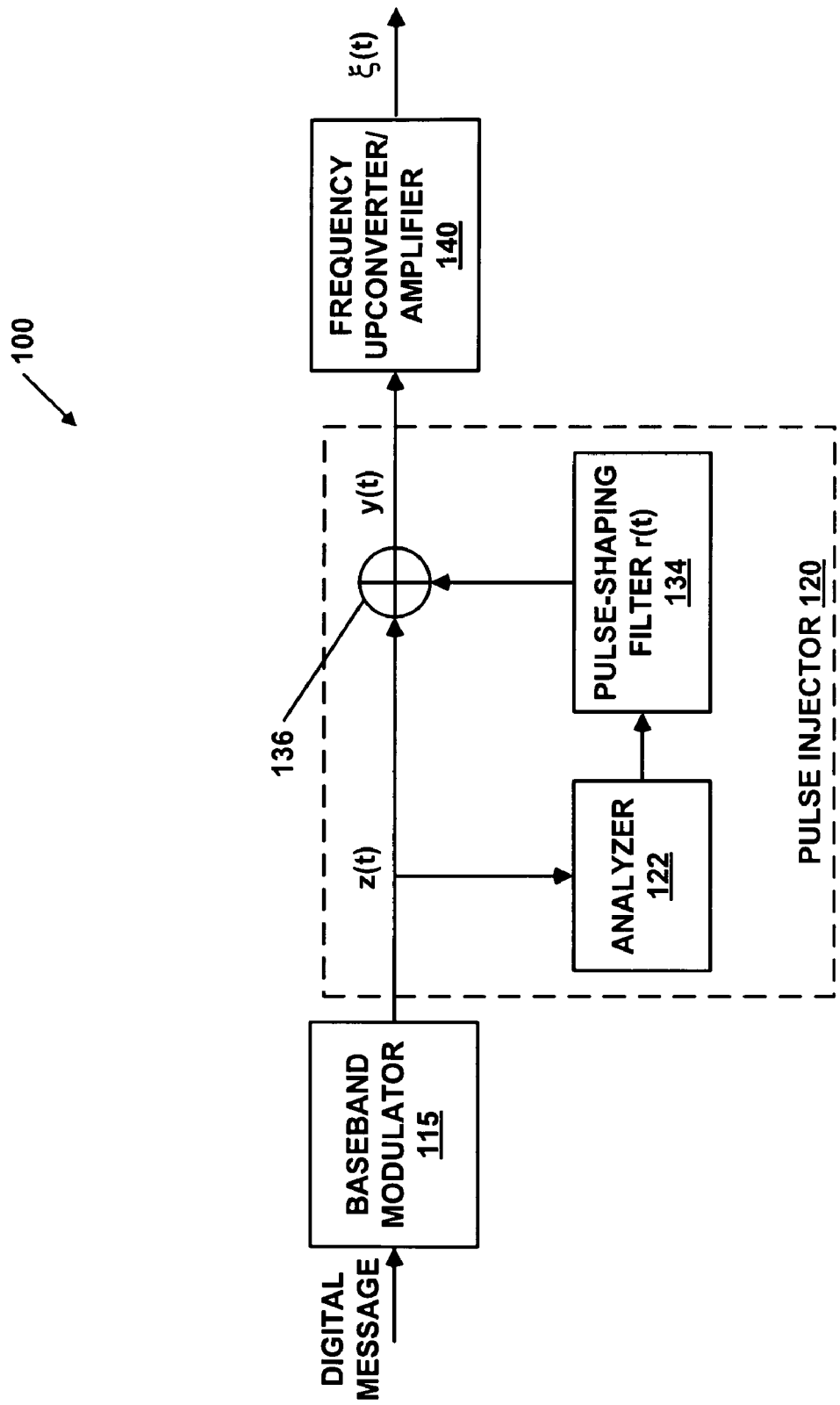
FIG. 2 is a block diagram of a PAM signal generator, according to an embodiment of the present invention.

Referring now to FIG. 2, there is shown a block diagram of a PAM signal generator 100, according to an embodiment of the present invention. The PAM signal generator 100 includes a baseband modulator 115 that outputs a modulated baseband signal z(t). The modulated baseband signal z(t) is coupled to an input of a pulse injector 120, which is operable to add a pulse to the modulated baseband signal z(t) at time intervals in which the signal amplitude exceeds a predetermined threshold to create a modified baseband signal y(t). The modulated baseband signal z(t) passes into analyzer 122, which determines appropriate perturbation instances $t_m$, and outputs a perturbation sequence value $b_m$ at time instant $t_m$. The perturbation sequence value $b_m$ passes through a pulse-shaping filter 134 having an impulse response r(t), the output of which is added to the modulated baseband signal z(t), via adder 136, to produce the modified baseband signal y(t). The modified baseband signal y(t) is passed to a frequency upconverter/amplifier 140 or any appropriate means for frequency upconversion. The impulse response r(t) of the pulse-shaping filter 134 can be identical to the original pulse p(t), as described above, or it can be different from p(t) (e.g., it may be a truncated version of p(t) to simplify implementation).

Figure 3:
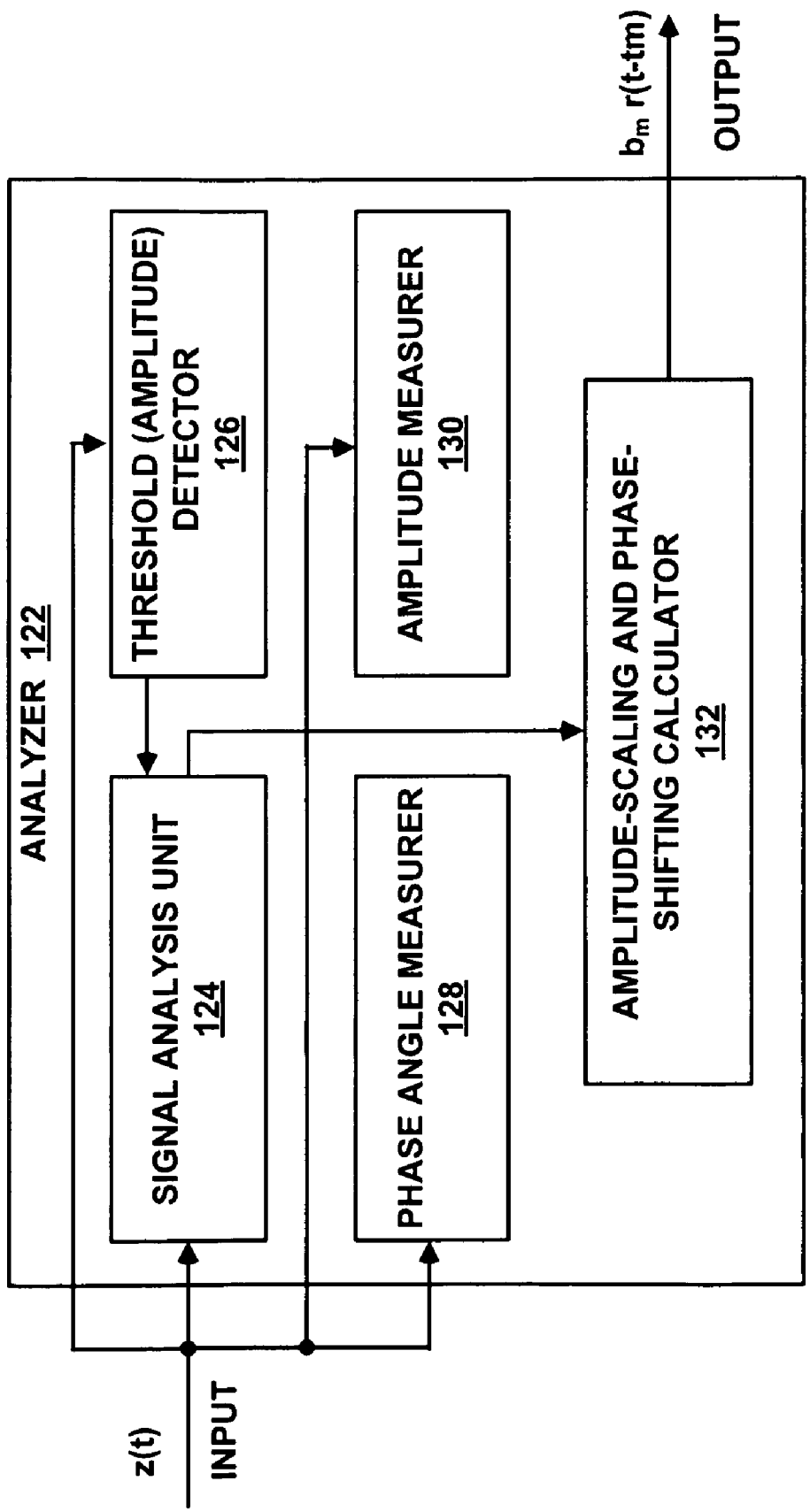
FIG. 3 is a vector diagram of a modulated baseband signal z(t)
Figure 4:
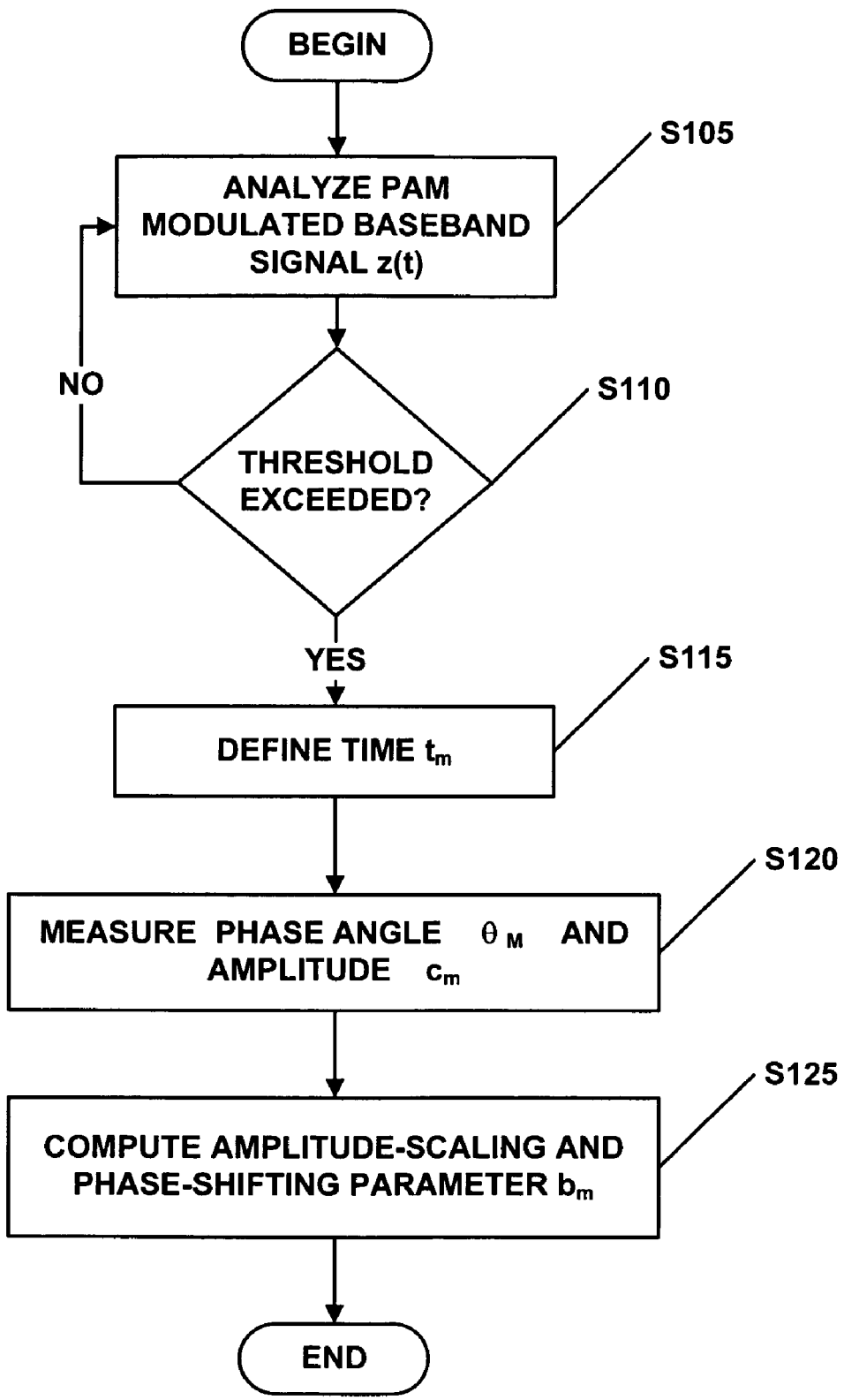
FIG. 4 is a vector diagram of the modulated baseband signal z(t) in the vicinity of a peak-amplitude event.

Referring now to FIGS. 3 and 4, an exemplary embodiment of the analyzer 122 and it's method of operation are shown. The analyzer 122 includes a signal analysis unit 124, a threshold (amplitude) detector 126, phase angle measurer 128, amplitude measurer 130 and amplitude-scaling and phase-shifting calculator 132. In operation, beginning with step S105, the signal analysis unit 124 receives, as input, and observe the modulated baseband signal z(t). The threshold detector 126 detects, at step S110, when (the time) the threshold is exceeded in the modulated baseband signal z(t) to define the time $t_m$, at step S115. At step S120, the analyzer 122 then measures the phase angle $\theta_m$ via phase angle measurer 128 and amplitude $c_m$ via amplitude measurer 130 of the modulated baseband signal z(t) at the point $t_m$. Thereafter, the analyzer 122 computes the amplitude-scaling and phase-shifting parameter $b_m$ via amplitude-scaling and phase-shifting calculator 132, at step S125.

According to one embodiment, $b_m$ is calculated using equation Eq. (6)

$$b_m = (d-c_m)\exp(j\theta_m) \qquad \text{Eq. (6)}$$

where d is the desired peak amplitude.

Assuming that the pulse-shaping filter 134 has a peak amplitude equal to unity, adding the signal $b_m r(t-t_m)$ to z(t) reduces the peak amplitude from $c_m$ to the desired peak amplitude d.

Figure 5:
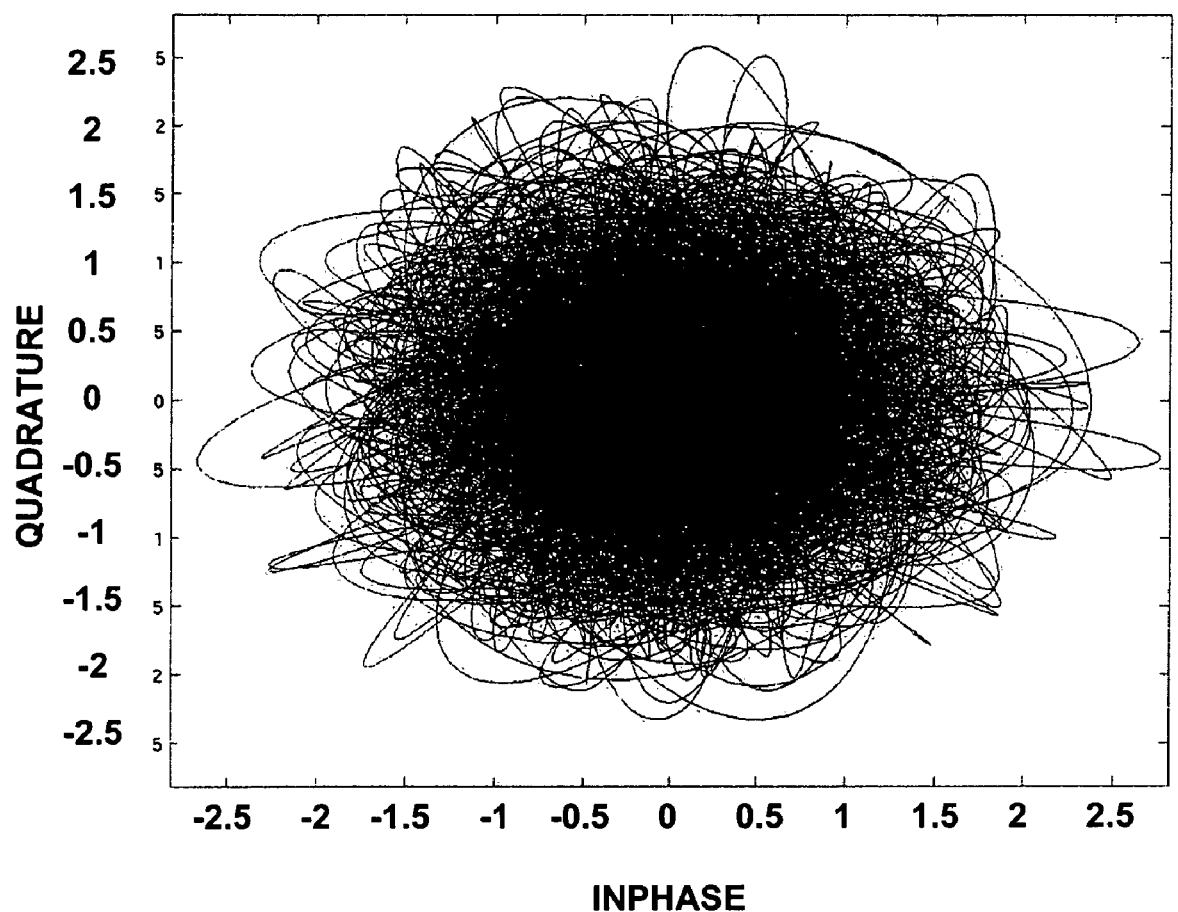
FIG. 5 is a vector diagram of a modified baseband signal y(t) in the vicinity of the peak-amplitude event in FIG. 4, illustrating how the PAM generator in FIG. 2 operates to reduce the peak-to-RMS amplitude ratio of the modulated based band signal.

Referring now to FIG. 5, a vector signal diagram of an unperturbed modulated baseband signal z(t) is illustrated. The vector signal diagram plots the quadrature (imaginary) part of the modulated baseband signal z(t) versus the in-phase (real) part of the signal over a long period of time. The measured peak-to-RMS ratios at various percentiles are summarized in Table 1.

TABLE 1

Peak-to-RMS Ratio at Percentiles of Interest for IS-95 Reverse Channel Signal Having Multiple Supplementary Code Channels

| | Percentile (%) | | | |
|---|---|---|---|---|
| | 99 | 99.9 | 99.99 | 100 |
| Peak-to-RMS (dB) | 6.5 | 8.1 | 8.8 | 9 |

Figure 6:
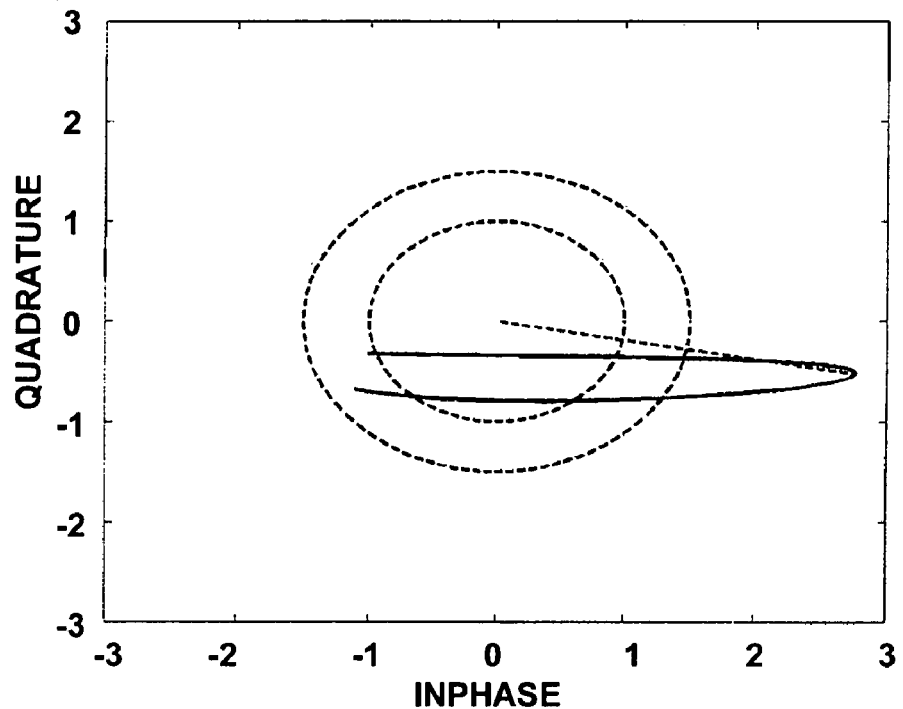
FIG. 6 is a graph of the out-of-band signal quality PSDs of the baseband and modified baseband signals z(t) and y(t)

FIG. 6 is a vector diagram of the modulated baseband signal z(t) during a brief time interval when the signal is near its maximum amplitude. The solid line depicts the signal during a brief time interval. The inner dashed circle represents the RMS value of the signal over all time. The outer dashed circle indicates the desired peak amplitude. The dashed line emanating from the origin intersects the signal at its point of maximum amplitude. In this example, the desired peak amplitude is 1.5 times the RMS value.

Figure 7:
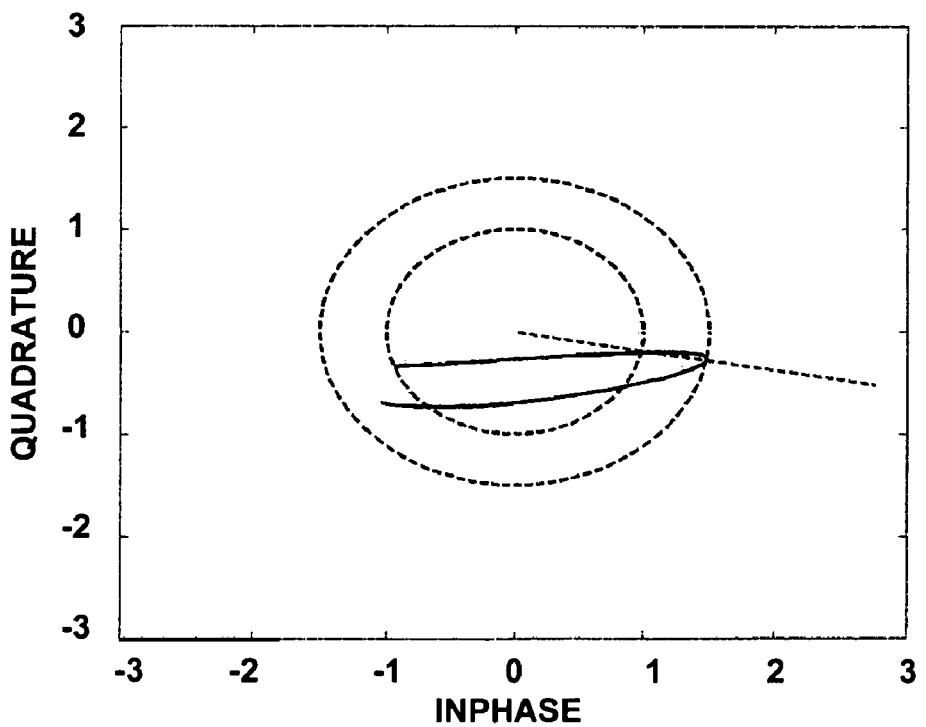
FIG. 7 is a graph of the in-band signal quality measure RHO versus amplitude threshold that illustrates how the peak-to-RMS amplitude reduction apparatus and methods of the present invention do not substantially degrade in-band signal quality.
Figure 8:
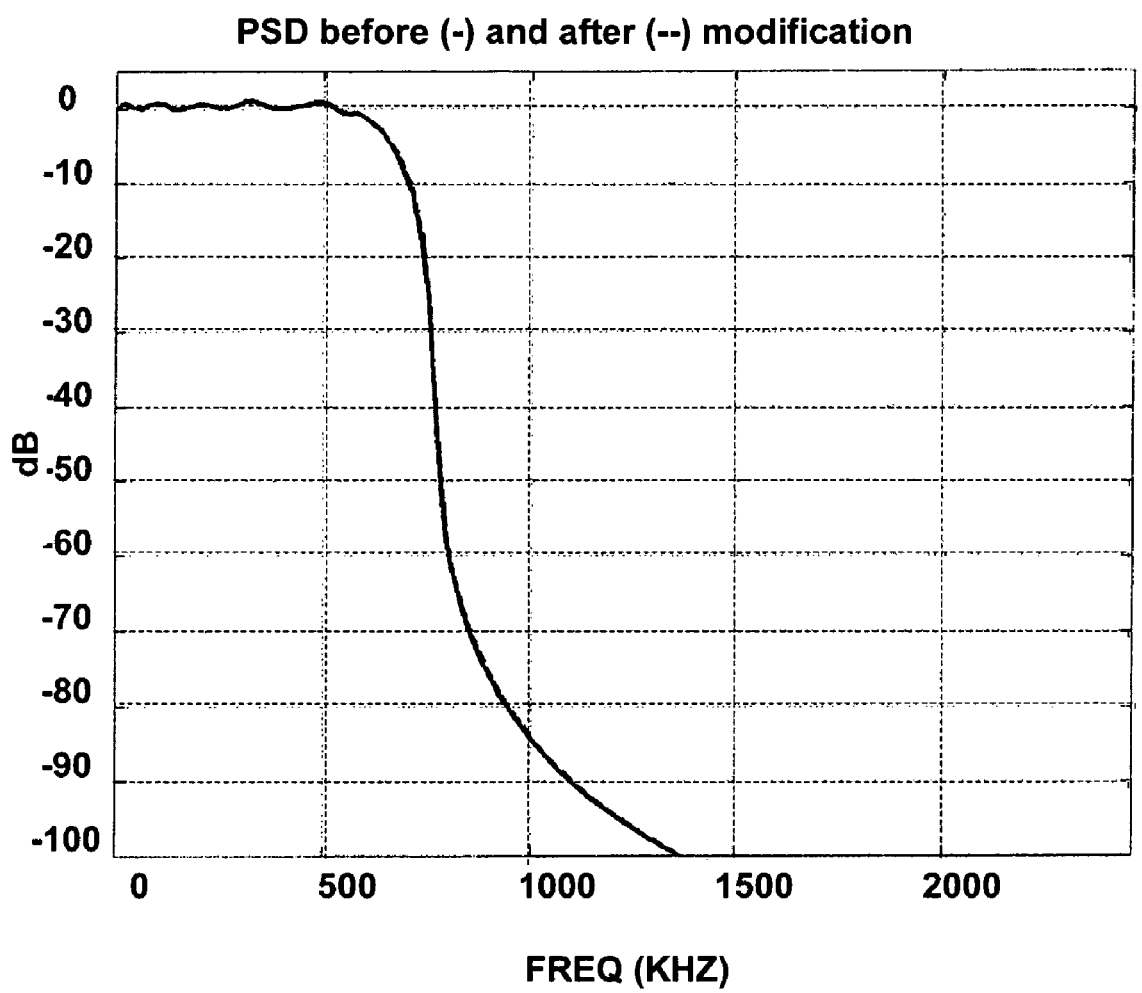
FIG. 8 is a graph of peak-to-RMS amplitude ratios versus amplitude threshold values for various in-band signal quality measures.

If the pulse-shaping filter 134 has a peak amplitude equal to unity, adding the signal $b_m r(t-t_m)$ to z(t) reduces the peak amplitude from $c_m$ to the desired peak amplitude d and the modified baseband signal y(t) is shown in FIG. 7. Clearly, the peak amplitude of the modified baseband signal y(t) is now below the desired peak amplitude as indicated by the outer dashed circle. The dashed line emanating from the origin indicates the location of the peak-amplitude event in z(t) prior to peak reduction. After processing about 4000 symbols with the invention in this example, the out-of band signal quality of the modified baseband signal y(t) can be measured using the PSD, as shown in FIG. 8 where it is overlaid with the PSD of the original modulated baseband signal z(t). The two PSDs have such similar shapes that it is difficult to distinguish between the two. This demonstrates the capability of the present invention to maintain out-of-band signal quality.

Figure 9:
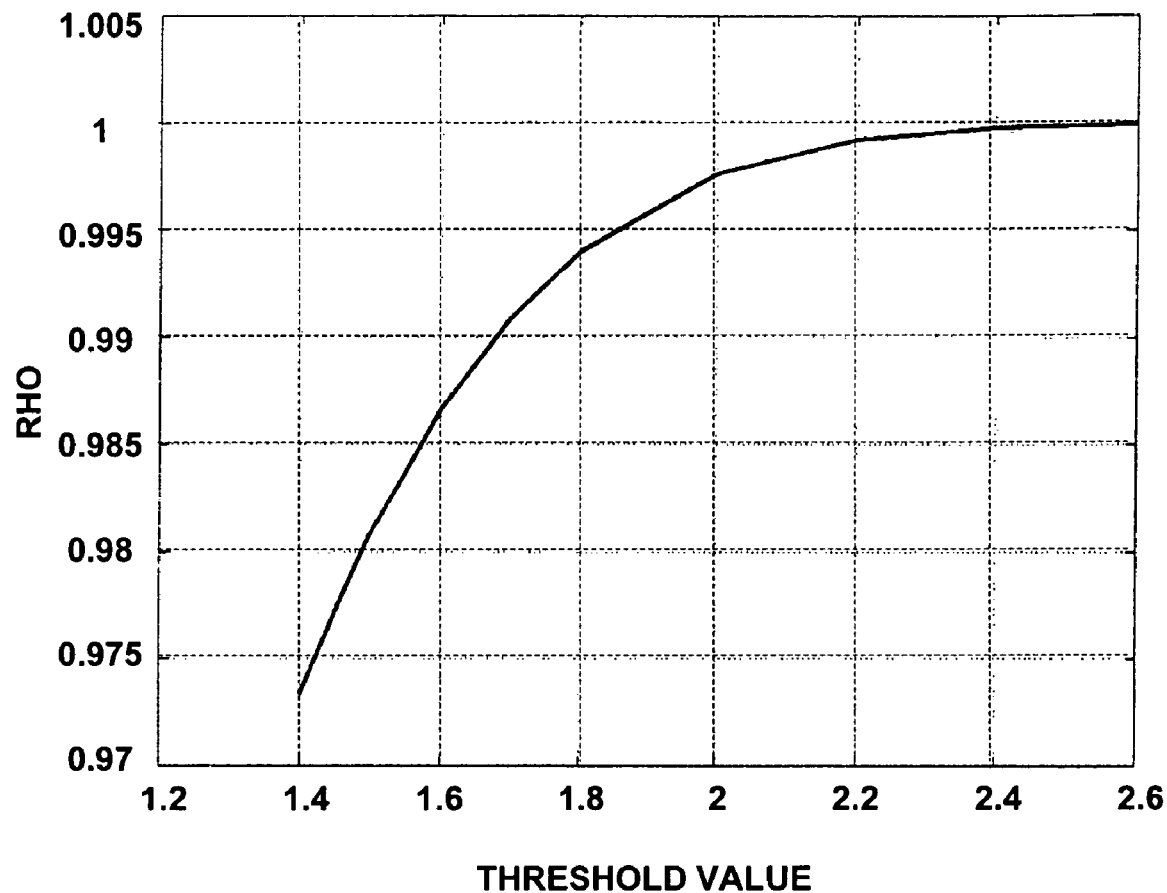
FIG. 9 is a block diagram of the analyzer of the PAM signal generator in FIG. 2, in accordance with embodiments of the present invention.

FIG. 9 illustrates the effect the PAM generator 100 of the present invention has on the in-band signal quality measure RHO. As d decreases, RHO decreases, indicating worsening in-band signal quality. In this example, the specification for RHO in the IS-95 standard is that RHO must exceed 0.94, over the range of desired peak amplitudes. For the range of desired peak amplitudes considered here, the in-band signal quality is shown to be in compliance with the specification.

Figure 10:
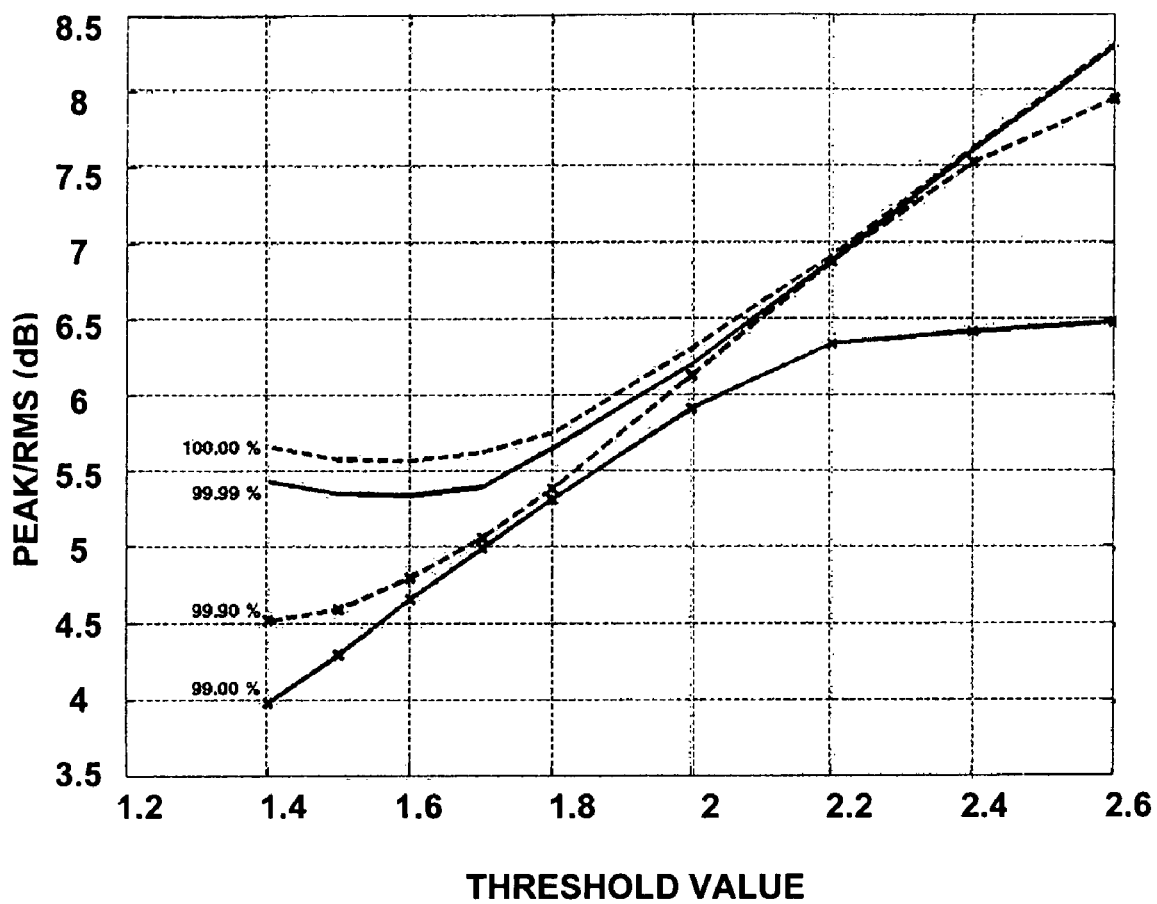
FIG. 10 is a flowchart illustrating an analysis process performed by the analyzer in FIG. 9, in accordance with embodiments of the present invention.

In exchange for these degraded levels of in-band signal quality, a range of reductions in peak-to-RMS ratio can be obtained, as shown in FIG. 10. For example, for a desired peak amplitude d=1.5, RHO exceeds 0.98 and the peak-to-RMS ratio at the $99.9^{th}$ percentile is 4.6 dB. When compared with the original peak-to-RMS ratio in z(t) of 8.1 dB at the $99.9^{th}$ percentile, it is clear in this example that the present invention has reduced the peak-to-RMS ratio by 3.5 dB with no degradation of the out-of-band signal quality, and minimal degradation of the in-band signal quality. Such a large reduction in peak-to-RMS ratio facilitates improved power efficiency and/or higher average power output capability by an amplifier, as will be appreciated by those skilled in amplifier design.

Figure 11A:
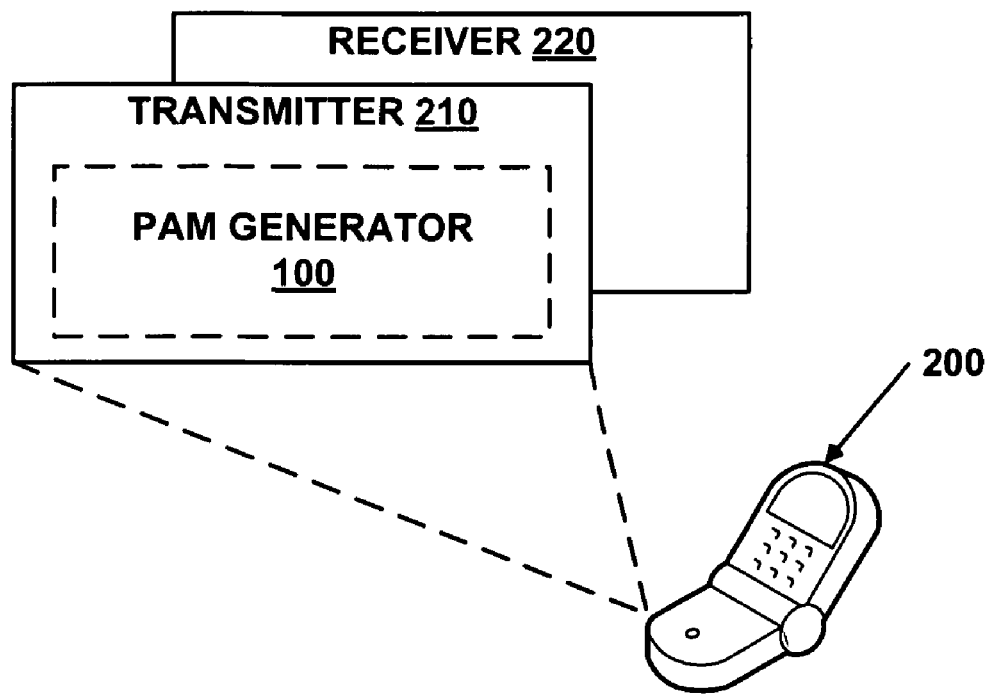
FIG. 11A is a diagram illustrating how the PAM signal generator in FIG. 2 may be used in a wireless handset, according to an embodiment of the present invention.
Figure 11B:
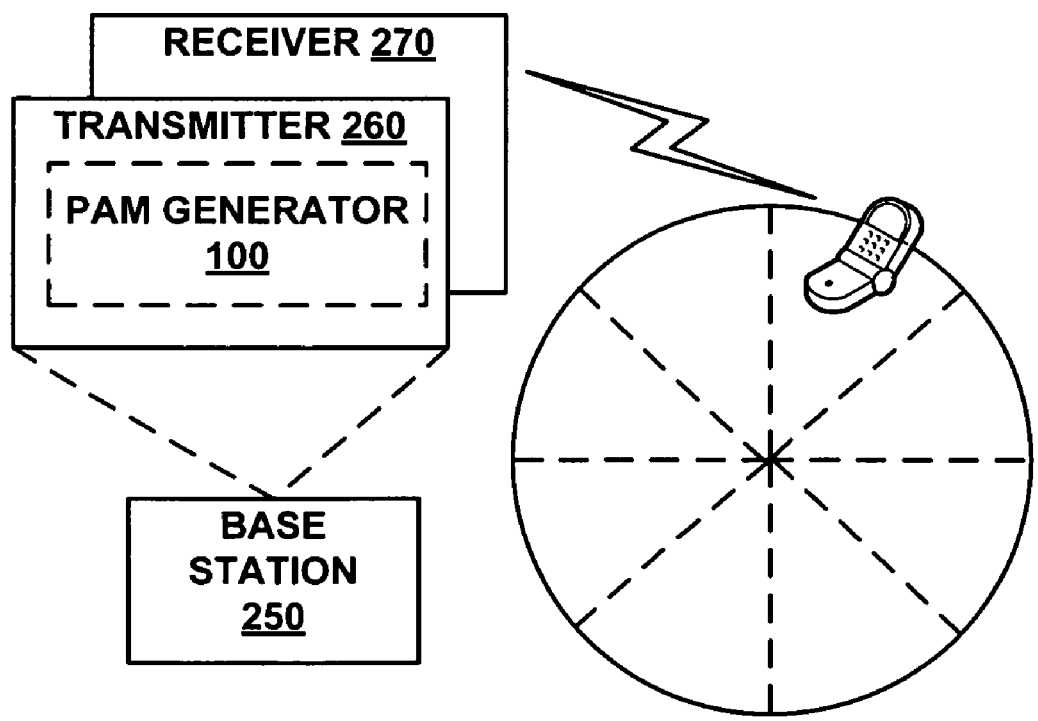

Referring now to FIGS. 11A and 11B, the PAM signal generator 100 in accordance with the present invention has application in wireless communication systems. For example, in wireless communication systems that use code division multiple access (CDMA) according to the IS-95 standard, the reverse channel that is transmitted by the handset is nominally defined to use offset quadrature phase shift keying (OQPSK) modulation. However, to accommodate higher data rates, the IS-95 standard allows so-called supplementary code channels. Thus, the signal to be transmitted is actually a sum of OQPSK signals. Unlike the nominally defined signal which has a relatively small peak-to-RMS ratio, the signal arising from supplementary code channels can have a very high peak-to-RMS ratio. This makes it difficult for conventional approaches to produce the average power needed for good reception at the receiver while maintaining acceptable in-band signal quality (RHO) and out-of-band signal quality (PSD). These problems and limitations are avoided and overcome by employing the PAM signal generator 100 of the present invention. FIG. 11A illustrates, for example, how the PAM signal generator 100 may be configured in the transmitter 210 of a mobile handset 200. FIG. 11B shows, as another example, how the PAM generator 100 may be configured in the transmitter 260 of a basestation 250 of a cellular or other wireless communications network.

The present invention has been described with reference to specific exemplary embodiments. These specific exemplary embodiments are merely illustrative, and are not meant to restrict the scope or applicability of the present invention in any way. Various modifications or changes to the specific exemplary embodiments will also be suggested to those of ordinary skill in the art. For these reasons, the spirit and scope of the present invention should be construed as being limited only by the terms of the appended claims.

What is claimed is:

1. A pulse amplitude modulated (PAM) signal generator comprising:
   a modulator operable to generate a PAM baseband signal; and, a pulse injector operable to form a pulse and add the formed pulse into the PAM baseband signal at a time interval in which an amplitude of the PAM baseband signal exceeds a predetermined threshold to create a modified baseband signal.

2. The generator of claim 1 wherein the formed pulse, when added to the PAM baseband signal, serves to reduce a peak amplitude to RMS amplitude ratio without substantially degrading a power spectral density.

3. The generator of claim 1 wherein said pulse injector comprises:
   a signal analyzer configured to analyze the PAM baseband signal to determine if the predetermined threshold has been exceeded and produces an output having an amplitude-scaling and phase-shifting parameter applied to the pulse;
   a pulse-shaping filter configured to filter with an impulse response the output having the amplitude-scaling and phase-shifting parameter to output the formed pulse; and,
   an adder configured to add the formed pulse of the filter to the PAM baseband signal.

4. The generator of claim 3 wherein the signal analyzer comprises:
   a threshold detector configured to detect when the predetermined threshold is exceeded;
   a phase angle measurer configured to measure a phase angle $\theta_m$ of the PAM baseband signal at a point in time when the threshold is exceeded;
   an amplitude measurer configured to measure an amplitude $c_m$ of the PAM baseband signal; and,
   an amplitude-scaling and phase-shifting calculator configured to compute the amplitude-scaling and phase-shifting parameter for the pulse using the phase angle $\theta_m$ and amplitude $c_m$.

5. The generator of claim 1 wherein the formed pulse, when added to the PAM baseband signal, serves to reduce a peak amplitude to RMS amplitude ratio without substantially degrading a power spectral density of the signal and while substantially maintaining an in-band measure of signal quality.

6. The generator of claim 1, further comprising
   a frequency upconverter and amplifier stage configured to upconvert and amplify the modified baseband signal.

7. The generator of claim 1 wherein a perturbation sequence representing amplitude-scaling and phase-shifting is applied to the pulse so that when the pulse is added to the PAM baseband signal, the amplitude is reduced to a desired peak amplitude during the time interval.

8. A pulse amplitude modulated (PAM) signal generator comprising:
   means for modulating a signal into a PAM baseband signal; and,
   means for forming a pulse and adding the formed pulse into the PAM baseband signal at a time interval in which an amplitude of the PAM baseband signal exceeds a predetermined threshold to create a modified baseband signal.

9. The generator of claim 8 wherein the formed pulse, when added to the PAM baseband signal, serves to reduce a peak amplitude to RMS amplitude ratio without substantially degrading a power spectral density.

10. The generator of claim 8 wherein the pulse forming and adding means comprises:
    means for analyzing the PAM baseband signal to determine if the predetermined threshold has been exceeded and produce an output having an amplitude-scaling and phase-shifting parameter applied to the pulse;
    means for filtering with an impulse response the output having the amplitude-scaling and phase-shifting parameter to output the formed pulse; and,
    means for adding the formed pulse to the PAM baseband signal.

11. The generator of claim 10 wherein the analyzing means comprises:
    means for detecting when the predetermined threshold is exceeded;

means for measuring a phase angle θm of the PAM baseband signal at a point in time when the threshold is exceeded;

means for measuring an amplitude $c_m$ of the PAM baseband signal; and, means for computing the amplitude-scaling and phase-shifting parameter for the pulse using the phase angle $\theta_m$ and amplitude $c_m$.

12. The generator of claim 8 wherein the formed pulse, when added to the PAM baseband signal serves to reduce a peak amplitude to RMS amplitude ratio without substantially degrading a power spectral density of the signal and while substantially maintaining an in-band measure of signal quality.

13. The generator of claim 8, further comprising means for frequency upconverting and amplifying the modified baseband signal.

14. A method for generating a pulse amplitude modulated (PAM) signal comprising:

modulating a signal into a PAM baseband signal;

forming a pulse that is a copy of a pulse in the PAM baseband signal; and, adding the formed pulse into the PAM baseband signal at a time interval in which an amplitude of the PAM baseband signal exceeds a predetermined threshold to create a modified baseband signal.

15. The method of claim 14 wherein forming a copy of a pulse in the PAM baseband signal comprises:

forming the pulse to reduce a peak amplitude to RMS amplitude ratio without substantially degrading a power spectral density.

16. The method of claim 14 wherein forming the pulse comprises:

analyzing the PAM baseband signal to determine if the predetermined threshold has been exceeded;

producing and applying an amplitude-scaling and phase-shifting parameter to the pulse and forming an output; and, filtering with an impulse response the output having the amplitude-scaling and phase-shifting parameter to output the formed pulse.

17. The method of claim 16 wherein analyzing the PAM baseband signal comprises:

detecting when the predetermined threshold is exceeded;

measuring a phase angle $\theta_m$ of the PAM baseband signal at a point in time when the threshold is exceeded;

measuring an amplitude $c_m$ of the PAM baseband signal; and computing the amplitude-scaling and phase-shifting parameter for the pulse using the phase angle $\theta_m$ and amplitude $c_m$.

18. The method of claim 14 wherein forming a copy of a pulse in the PAM baseband signal comprises:

forming the pulse so that when added to the PAM baseband signal, said pulse serves to reduce a peak amplitude to RMS amplitude ratio without substantially degrading a power spectral density and substantially maintaining an in-band measure of signal quality.

19. The method of claim 14, further comprising:

frequency upconverting the modified baseband signal; and amplifying the frequency upconverted signal.

20. The method of claim 14 wherein adding the formed pulse into the PAM baseband signal comprises applying a perturbation sequence representing amplitude-scaling and phase-shifting to the pulse so that when the pulse is added to the PAM baseband signal, the amplitude is reduced to a desired peak amplitude during the time interval.

\* \* \* \* \*

UNITED STATES PATENT AND TRADEMARK OFFICE
CERTIFICATE OF CORRECTION

PATENT NO. : 7,639,098 B2  Page 1 of 1
APPLICATION NO. : 12/042689
DATED : December 29, 2009
INVENTOR(S) : Schell et al.

It is certified that error appears in the above-identified patent and that said Letters Patent is hereby corrected as shown below:

In the Claims:

Claim 11, Column 9, line 1, "θm" should be -- $\theta_m$ --

Signed and Sealed this

Thirteenth Day of April, 2010

David J. Kappos
*Director of the United States Patent and Trademark Office*